(12) United States Patent
Kitai et al.

(10) Patent No.: US 11,770,904 B2
(45) Date of Patent: Sep. 26, 2023

(54) SURFACE-TREATED COPPER FOIL, AND COPPER-CLAD LAMINATE PLATE, RESIN-ATTACHED COPPER FOIL AND CIRCUIT BOARD EACH USING SAME

(71) Applicants: PANASONIC INTELLECTUAL PROPERTY MANAGEMENT CO., LTD., Osaka (JP); Fukuda Metal Foil & Powder Co., Ltd., Kyoto (JP)

(72) Inventors: Yuki Kitai, Osaka (JP); Takeshi Okamoto, Kyoto (JP)

(73) Assignees: PANASONIC INTELLECTUAL PROPERTY MANAGEMENT CO., LTD., Osaka (JP); FUKUDA METAL FOIL & POWDER CO., LTD., Kyoto (JP)

( * ) Notice: Subject to any disclaimer, the term of this patent is extended or adjusted under 35 U.S.C. 154(b) by 183 days.

(21) Appl. No.: 17/426,310

(22) PCT Filed: Dec. 24, 2019

(86) PCT No.: PCT/JP2019/050697
§ 371 (c)(1),
(2) Date: Jul. 28, 2021

(87) PCT Pub. No.: WO2020/162068
PCT Pub. Date: Aug. 13, 2020

(65) Prior Publication Data
US 2022/0087032 A1    Mar. 17, 2022

(30) Foreign Application Priority Data
Feb. 4, 2019    (JP) .................... 2019-018095

(51) Int. Cl.
*B32B 3/00* (2006.01)
*H05K 3/38* (2006.01)
*H05K 1/09* (2006.01)

(52) U.S. Cl.
CPC ............... *H05K 3/389* (2013.01); *H05K 1/09* (2013.01); *H05K 3/384* (2013.01); *H05K 2201/0355* (2013.01)

(58) Field of Classification Search
CPC .......... H05K 3/384; H05K 3/389; H05K 3/01; H05K 2201/0355; H05K 3/09
See application file for complete search history.

(56) References Cited

U.S. PATENT DOCUMENTS

| 2004/0241487 | A1* | 12/2004 | Nagatani | ............... H05K 3/025 428/606 |
| 2018/0160546 | A1 | 6/2018 | Ori et al. | |
| 2019/0145014 | A1* | 5/2019 | Chen | ........................ C25D 5/12 205/152 |

FOREIGN PATENT DOCUMENTS

| JP | 2015-61934 | 4/2015 |
| JP | 6110581 | 4/2017 |

(Continued)

OTHER PUBLICATIONS

International Search Report issued in International Patent Application No. PCT/JP2019/050697, dated Mar. 31, 2020, along with an English translation thereof.

*Primary Examiner* — Elizabeth E Mulvaney
(74) *Attorney, Agent, or Firm* — GREENBLUM & BERNSTEIN, P.L.C.

(57) ABSTRACT

A surface treated copper foil includes: a copper foil; a finely roughened particle treatment layer of copper on at least one surface of the copper foil, the finely roughened particle treatment layer including fine copper particles having a particle size of 40 to 200 nm; a heat resistance treatment (Continued)

layer containing nickel on the finely roughened particle treatment layer; a rust prevention treatment layer containing at least chromium on the heat resistance treatment layer; and a silane coupling agent treatment layer on the rust prevention treatment layer. An amount of nickel attached in the heat resistance treatment layer is 30 to 60 mg/m2.

5 Claims, 1 Drawing Sheet

(56) References Cited

FOREIGN PATENT DOCUMENTS

| | | |
|---|---|---|
| JP | 6182584 | 8/2017 |
| JP | 2018-90906 | 6/2018 |

\* cited by examiner

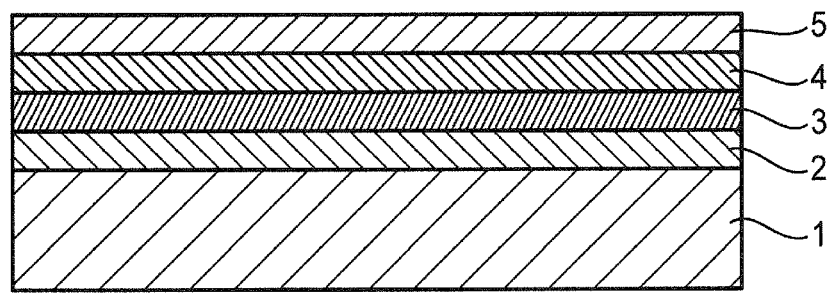

SURFACE-TREATED COPPER FOIL, AND COPPER-CLAD LAMINATE PLATE, RESIN-ATTACHED COPPER FOIL AND CIRCUIT BOARD EACH USING SAME

TECHNICAL FIELD

The present invention relates to a surface-treated copper foil, and to a copper-clad laminate, a copper foil with resin, and a circuit board each using the surface treated copper foil.

BACKGROUND ART

Various metal foils, particularly copper foils, are used as conductors in high speed signal transmission board that support high frequencies, but in the future, it will be required to support 5G and WiGig (Wireless Gigabit) that use signals with still higher frequencies than at present. Hence, it is demanded to further decrease the transmission loss of substrates.

It is required to improve the resin base material and copper foil constituting the substrate in order to decrease the transmission loss in such a problem. In other words, it is required to decrease a dielectric loss caused by the dielectric material of the resin base material and further to decrease the conductor loss of the copper foil.

Among these, regarding the improvement of copper foil, it has been hitherto attempted to decrease the conductor loss and the transmission loss by diminishing the surface roughness and the like. However, there is a problem that the adhesive property and heat resistance to the resin, which are essential as the basic properties of the copper foil used in the substrates, decrease in an attempt to decrease the transmission loss, and conversely, the transmission loss increases in an attempt to improve the adhesive property and heat resistance. Thus, it has been considered to be difficult to achieve both the transmission properties and the basic properties. The reason for this has been considered that when the surface roughness is diminished to decrease the transmission properties, the anchor effect to the resin is weaken, resulting in a lowered peel strength.

In addition, as a surface treated copper foil for high frequency signal transmission circuit formation, it has been reported that the roughening treatment layer which affects the transmission properties is formed of a non-conductive copper composite compound instead of conventional metal copper so that electricity does not flow and thus conductor loss due to the roughening treatment decreases (Patent Literature 1).

In a surface treated copper foil for printed wiring boards, it is also known to adjust the average height of roughened particles in the silane coupling agent layer which affects the transmission properties, or the nickel element amount in the metal treatment layer containing nickel (Patent Literature 2).

However, in the technique described in Patent Literature 1, barrier treatment, chromate treatment and the like are not performed, and thus there is a problem that the heat resistance is particularly inferior.

On the other hand, in the technique described in Patent Literature 2, the treated amount of the metal treatment layer which functions as a barrier treatment layer is small and there is thus a problem that it is difficult to secure heat resistance in a high temperature region (for example, 150° C. or higher).

The present invention has been achieved in view of such circumstances, and an object thereof is to provide a surface treated copper foil which can decrease the transmission loss of a high speed signal transmission board and reliably ensure the adhesive property to a resin base material and particularly heat resistance without a practical problem, and provide a copper-clad laminate, a copper foil with resin, and a circuit board each using the surface treated copper foil.

CITATION LIST

Patent Literature

Patent Literature 1: Japanese Patent Publication No. 6110581
Patent Literature 2: Japanese Patent Publication No. 6182584

SUMMARY OF INVENTION

A surface treated copper foil according to one aspect of the present invention includes: a copper foil; a finely roughened particle treatment layer of copper on at least one surface of the copper foil, the finely roughened particle treatment layer including fine copper particles having a particle size of 40 to 200 nm; a heat resistance treatment layer containing nickel on the finely roughened particle treatment layer; a rust prevention treatment layer containing at least chromium on the heat resistance treatment layer; and a silane coupling agent treatment layer on the rust prevention treatment layer. An amount of nickel attached in the heat resistance treatment layer is 30 to 60 mg/m$^2$.

BRIEF DESCRIPTION OF DRAWINGS

FIG. 1 is a schematic sectional view illustrating a configuration of a surface treated copper foil according to an embodiment of the present invention.

DESCRIPTION OF EMBODIMENTS

Surface Treated Copper Foil

As illustrated in FIG. 1, the surface treated copper foil according to the present embodiment is a surface treated copper foil including: a copper foil 1; a finely roughened particle treatment layer 2 of copper on at least one surface of the copper foil 1, the finely roughened particle treatment layer 2 including fine copper particles having a particle size of 40 to 200 nm; a heat resistance treatment layer 3 containing nickel on the finely roughened particle treatment layer 2; a rust prevention treatment layer 4 containing at least chromium on the heat resistance treatment layer 3; and a silane coupling agent treatment layer 5 on the rust prevention treatment layer. An amount of nickel attached in the heat resistance treatment layer is 30 to 60 mg/m$^2$.

With such a configuration, the adhesive property to the resin base material can be enhanced by providing a finely roughened particle treatment layer including finely roughened particles on the surface of the untreated copper foil, and both transmission properties and basic properties (adhesive property to the resin base material and heat resistance) can be achieved by adjusting the size of the finely roughened particles and particularly the amount of nickel attached in the heat resistance treatment layer.

Specifically, according to the present invention, it is possible to provide a surface treated copper foil which can decrease the transmission loss of a high speed signal transmission board, and reliably ensure the adhesive property to a resin base material and particularly heat resistance without a practical problem, and provide a copper-clad laminate, a copper foil with resin, and a circuit board each using the surface treated copper foil.

Hereinafter, first, the respective configurations of the surface treated copper foil of the present embodiment will be described in details.

Copper Foil

Hitherto, the copper foils used for rigid substrates and the like have been generally electrolytic copper foils and the copper foils used for flexible substrates and the like have been generally rolled copper foils. However, in recent years, electrolytic copper foils exhibiting properties similar to those of rolled copper foils have been developed particularly with the rise of the flexible substrate market. Currently, rolled copper foils and electrolytic copper foils are used regardless of the kind of substrate. Hence, the untreated copper foil used in the present embodiment is not limited to a rolled copper foil or an electrolytic copper foil, and any copper foil may be used.

Finely Roughened Particle Treatment Layer

The finely roughened particle treatment layer is a first surface treatment layer formed on the untreated copper foil, is a layer provided to increase the surface area and improve the peel strength to the resin base material, and includes fine copper particles having a particle size of 40 to 200 nm.

In the present embodiment, the particle size is used in the following meanings. In other words, copper particles are observed at a magnification of 80,000-fold while tilting the sample table by 40° roscope FE-SEM (JSM-7800F manufactured by JEOL Ltd.), and the heights of the observed copper particles are taken as the values of particle size. The particle size of the fine copper particles in the finely roughened particle treatment layer of the present embodiment has a maximum value of 200 nm and a minimum value of 40 nm in the range observed and measured by the above method.

The fine copper particle treatment layer in the present embodiment does not exclude that copper particles having a particle size of more than 200 nm and copper particles having a particle size of less than 40 nm are contained. However, the transmission loss may increase when there are a great number of particles larger than 200 nm. Further, sufficient adhesive property may not be secured when there are a great number of particles smaller than 40 nm. Thus, either of these cases is not preferable.

The finely roughened particle treatment layer can be formed by an electrolytic plating method.

The particle size of the fine copper particles of the present embodiment is strongly affected by the electrolytic current density as well as the bath composition for plating treatment. For example, the particle size of roughened particles tends to be small in a case where the electrolytic current density is high. Conversely, the particle size of roughened particles tends to be large in a case where the electrolytic current density is low. Hence, the electrolytic current density is required to be appropriately set in order to obtain roughened particles having a desired particle size.

Examples of the bath composition and electrolysis conditions for forming the finely roughened particle treatment layer of copper are presented below but are not particularly limited thereto.

Bath Composition

Copper sulfate pentahydrate: 10 to 70 g/L (particularly preferably 30 to 50 g/L)

Pentasodium diethylenetriaminepentaacetate (hereinafter DTPA·5Na): 50 to 150 g/L (particularly preferably 80 to 120 g/L)

pH: 3.0 to 6.0 (particularly preferably 3.5 to 5.5)

Sulfuric acid and sodium hydroxide are used to adjust pH.

Electrolysis Conditions

Current density: 0.5 to 10.0 A/dm$^2$ (particularly preferably 1.0 to 6.0 A/dm$^2$)

Electric quantity: 10 to 130 A·sec/dm$^2$ (particularly preferably 30 to 110 A·sec/dm$^2$)

Liquid temperature: 25° C. to 50° C. (particularly preferably 30° C. to 45° C.)

Anode: copper plate

The appropriate DTPA·5Na concentration is 50 to 150 g/L. However, it is difficult to obtain a sufficient refinement effect and the roughened particles are coarse in a case where the DTPA·5Na concentration is out of this range, for example, less than 50 g/L. The current efficiency decreases, the deposited amount by the roughening treatment extremely decreases, the voltage also increases, and this is uneconomical when the DTPA·5Na concentration exceeds 150 g/L.

The electric quantity is preferably 10 to 130 A·sec/dm$^2$, and there are advantages that copper particles having a particle size of 40 to 200 nm can be obtained and adhesive property to the resin can be easily secured when the electric quantity is in this range. On the contrary, in a case where the electric quantity is less than 10 A·sec/dm$^2$, the number of copper particles having a particle size of less than 40 nm increases and the adhesive property may decrease. In a case where the electric quantity is more than 130 A·sec/dm$^2$, the particle shape is likely to be dendritic, and the particle size is likely to be coarse. As a result, troubles are caused that the sticking tendency to the untreated copper foil decreases, powders often fall, and the surface roughness of the laminated surface increases.

Heat Resistance Treatment Layer

The heat resistance treatment layer is a layer for heat resistance and rust prevention, which is provided to protect the copper foil together with the finely roughened particle treatment layer from stress such as chemicals and heat, and is called a barrier treatment layer in some cases. The heat resistance treatment layer of the present embodiment contains nickel, or nickel and phosphorus, and the amount of nickel attached in the heat resistance treatment layer is 30 to 60 mg/m$^2$.

As the amount of attached nickel is 30 to 60 mg/m$^2$, both the transmission properties and the basic properties can be achieved. When the amount of attached nickel is less than 30 mg/m$^2$, the heat resistance decreases, and for example, swelling occurs at the interface between the resin and the copper foil, and as a result, the adhesive property may decrease. When the amount of attached nickel exceeds 60 mg/m$^2$, the transmission loss may increase. A more preferable range of the amount of attached nickel is 40 to 50 mg/m$^2$.

In the present embodiment, the term "attached amount" and the like refers to the mass per unit area of nickel deposited by plating (for example, electrolytic plating) on the finely roughened particle treatment layer side of the copper foil. The attached amount can be measured by a method in which the copper foil to be treated is dissolved in nitric acid or the like, the solution is diluted, and the nickel concentration is analyzed using an ICP emission spectrophotometer.

The heat resistance treatment layer of the present embodiment preferably contains nickel, or nickel and phosphorus.

The heat resistance treatment layer of the present embodiment is a second surface treatment layer formed after the finely roughened particle treatment layer is formed, and can be formed by an electrolytic plating method. The amount of attached nickel can be adjusted by the current conditions when this electrolytic plating is performed.

Examples of the bath composition and electrolysis conditions for forming the heat resistance treatment layer of the present embodiment containing nickel and phosphorus are presented below but are not particularly limited thereto.

Bath Composition
Nickel sulfate hexahydrate: 10 to 100 g/L (particularly preferably 20 to 60 g/L)
Sodium acetate trihydrate: 2 to 40 g/L (particularly preferably 5 to 30 g/L)
Sodium hypophosphate monohydrate: 0.1 to 10 g/L (particularly preferably 1.0 to 6.0 g/L)
pH: 3.0 to 5.5 (particularly preferably 3.5 to 5.0)
Electrolysis Conditions
Current density: 0.5 to 3.5 A/dm$^2$ (particularly preferably 1.0 to 2.0 A/dm$^2$)
Electric quantity: 1.8 to 2.7 A·sec/dm$^2$ (particularly preferably 2.0 to 2.5 A·sec/dm$^2$)
Liquid temperature: 25° C. to 50° C. (particularly preferably 30° C. to 40° C.)
Anode: insoluble electrode such as platinum group oxide coated titanium As a supply source of nickel ions, nickel sulfate hexahydrate, nickel chloride hexahydrate, nickel acetate tetrahydrate and the like can be used. As a supply source of phosphorus ions, sodium phosphite, sodium hypophosphite, nickel phosphite and the like can be used. Sodium sulfate may be added to impart conductivity.

Rust Prevention Treatment Layer

The rust prevention treatment layer is a layer provided to prevent oxidation at the time of heating and storage. The rust prevention treatment layer of the present embodiment contains at least chromium and is called a chromate treatment layer in some cases. The rust prevention treatment layer may further contain zinc.

The rust prevention treatment layer of the present embodiment is a third surface treatment layer formed after the heat resistance treatment layer is formed, and can be formed by an electrolytic plating method.

The bath composition for forming the rust prevention treatment layer of the present embodiment may be a known one, and examples thereof include a bath composition having hexavalent chromium such as chromic acid, sodium dichromate, and potassium dichromate. The deposited form of chromium after formation of the rust prevention treatment layer represents a state in which $Cr(OH)_3$ and $Cr_2O_3$ are mixed, and chromium is deposited in the form of trivalent chromium instead of hexavalent chromium that adversely affects the human body. The chromic acid solution may be alkaline or acidic.

As an alkaline chromic acid solution, an alkaline zinc chromate solution containing zinc ions and hexavalent chromium ions described in JP S58-15950 B may be used. By using this chromic acid solution, it is possible to improve the rust preventive property as compared with the rust prevention treatment layer formed from a chromium single acid solution.

Examples of the electrolysis bath and electrolysis conditions for forming the rust prevention treatment layer of the present embodiment include the bath composition and conditions as presented below, but are not limited thereto.

Bath Composition
Sodium dichromate: 2.5 to 60 g/L (particularly preferably 5 to 30 g/L)
Zinc ion: 0.25 to 16 g/L (particularly preferably 0.5 to 8 g/L)
Sodium hydroxide: 10 to 180 g/L (particularly preferably 20 to 90 g/L)
Electrolysis Conditions
Current density: 1.5 to 8.0 A/dm$^2$ (particularly preferably 3.0 to 4.0 A/dm$^2$)
Electric quantity: 4.5 to 6.5 A·sec/dm$^2$ (particularly preferably 5.0 to 6.0 A·sec/dm$^2$)
Liquid temperature: 25° C. to 50° C. (particularly preferably 30° C. to 40° C.)
Anode: insoluble electrode such as platinum group oxide coated titanium Silane Coupling Agent Treatment Layer The silane coupling agent treatment layer of the present embodiment is a fourth surface treatment layer formed after the rust prevention treatment layer is formed and is a layer provided to further improve the adhesive property to the resin base material. By further providing the silane coupling agent treatment layer, not only the peel strength can be improved but also the deterioration of the peel strength after the harsh test can be suppressed, the rust preventive property is also improved, and the copper foil for circuit board with excellent versatility is obtained.

The silane coupling agent treatment layer of the present embodiment can be formed by adding an appropriate amount of silane coupling agent to water or the like to prepare an aqueous solution and performing application of the aqueous solution by immersion treatment or spraying treatment, then washing with water, and drying. As the silane coupling agent, one selected from various kinds such as an epoxy group, an amino group, a mercapto group, a vinyl group, a methacryloxy group, and a styryl group can be used. However, various silane coupling agents have different properties from each other and are compatible with the base material, and it is required to appropriately select and use one.

Examples of the bath for forming the silane coupling agent treatment layer include the bath composition and conditions as presented below, but are not limited thereto.

Bath Composition and Conditions
γ-Aminopropyltriethoxysilane: 1 to 5 mL/L (particularly preferably 2 to 4 mL/L)
Liquid temperature: 25° C. to 35° C. (particularly preferably 28° C. to 32° C.)
Immersion time: 15 seconds Copper-Clad Laminate A copper-clad laminate of the present embodiment includes an insulating layer formed of a cured product of a resin composition and the above-described copper foil on one surface or both surfaces of the insulating layer. With such a configuration, it is possible to provide a highly reliable copper-clad laminate which exhibits heat resistance and has decreased transmission loss.

In the present embodiment, the cured product of a resin composition refers to a cured product in a state in which the curing reaction has proceeded and the resin is crosslinked so that the cured product does not melt even when heated. The semi-cured product of a resin composition is in a state in which the resin composition is cured to an extent that the resin composition can be further cured. In other words, the semi-cured product is in a state in which the resin composition is semi-cured (B-staged). For example, when the resin composition is heated, the viscosity gradually decreases at the beginning, then curing starts, and the viscosity gradually increases. In such a case, the semi-cured state includes a state in which the viscosity has started to increase but curing is not completed, and the like.

Insulating Layer

The insulating layer included in the copper-clad laminate of the present embodiment is formed of a cured product of a resin composition described below. The insulating layer may further contain a glass base material described later. The thickness of the insulating layer is not particularly limited but is about 20 to 800 μm.

The resin composition forming the insulating layer of the present embodiment is not particularly limited as long as the resin composition includes a thermosetting resin and/or a thermoplastic resin. Examples of the thermosetting resin can include an epoxy resin, a low molecular polyphenylene ether resin, a cyanate ester resin, a phenol resin, benzoxazine, and a resin containing acid anhydride or an unsaturated group (e.g., acryl, methacryl, allyl, styryl, butadiene, and maleimide) alone or in combination as a copolymer. Examples of the thermoplastic resin include a polyphenylene ether resin, a polyphenylene sulfide resin, a liquid crystal polymer, a polyethylene resin, a polystyrene resin, a polytetrafluoroethylene resin, a cycloolefin polymer, and a cycloolefin copolymer. The resins may be used singly or two or more kinds thereof may be used concurrently.

Among the resins, resins each can achieve a low dielectric constant and a low dielectric loss tangent, and exhibit high heat resistance in a cured product or semi-cured product are more preferable.

The resin composition as described above is usually prepared in the form of a varnish and is often used as a resin varnish when a copper-clad laminate is manufactured. Such a resin varnish is prepared, for example, as follows.

First, the respective components, such as a thermosetting resin, a thermosetting curing agent, and various additives if necessary, which can be dissolved in an organic solvent are added to the organic solvent and dissolved. At this time, heating may be performed if necessary. Thereafter, if necessary, components, such as an inorganic filler, which are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the thermosetting resin, the thermosetting curing agent and the like, and does not inhibit the curing reaction. Specific examples thereof include toluene, methyl ethyl ketone, cyclohexanone, and propylene glycol monomethyl ether acetate. These may be used singly or two or more kinds thereof may be used concurrently.

It is preferable that the insulating layer of the present embodiment further contains a glass base material in addition to a cured product of the resin composition. This provides advantages that it is possible to suppress processing troubles (cracking and the like), diminish dimensional changes, decrease linear expansion, or suppress warpage.

In a case where the insulating layer of the present embodiment contains a glass base material, the insulating layer may be used as a prepreg obtained by impregnating the glass base material with the above-described resin composition. Examples of the method for manufacturing such a prepreg include a method in which a glass base material is impregnated with the above-described resin varnish (resin composition prepared in the form of a varnish), and then dried.

The impregnation of a glass base material with the resin varnish is performed by immersion, coating and the like. If necessary, it is possible to repeat this impregnation a plurality of times. At this time, it is also possible to finally adjust the composition and resin amount to the desired composition and resin amount by repeating the impregnation using a plurality of resin varnishes having different compositions and concentrations.

The glass base material impregnated with the resin varnish is heated under desired heating conditions, for example, at 80° C. to 170° C. for 1 to 10 minutes to obtain a prepreg in a semi-cured state (B stage).

Method for Manufacturing Copper-Clad Laminate

As the copper-clad laminate of the present embodiment, a double-sided copper foil-clad or single-sided copper foil-clad laminate can be fabricated by, for example, stacking one or more prepregs containing the thermosetting resin composition as described above, further stacking a copper foil as described above on either or both of the upper and lower surfaces so that the silane coupling agent treatment layer comes into contact with the prepreg, and subjecting this stacked body to hot press molding for lamination and integration.

The heating and pressing conditions can be appropriately set depending on the thickness of the laminate to be manufactured, the kind of resin composition, and the like. For example, the temperature can be set to 170° C. to 220° C., the pressure can be set to 1.5 to 5.0 MPa, and the time can be set to 60 to 150 minutes.

Copper Foil with Resin

A copper foil with resin of the present embodiment has a configuration in which a resin layer containing a resin composition or a semi-cured product of the resin composition and a copper foil provided on one surface of the resin layer are laminated. In other words, the copper foil with resin of the present embodiment may be a copper foil with resin including a resin layer containing a resin composition before being cured (A-stage resin composition) and a copper foil, or a copper foil with resin including a resin layer containing a semi-cured product of a resin composition (B-stage resin composition) and a copper foil.

As the resin composition used for the resin layer, and the copper foil, a resin composition and a copper foil similar to those described in the copper-clad laminate can be used. In the copper foil with resin of the present embodiment, the resin composition or a semi-cured product thereof may be the resin composition which is dried or heat-dried.

Examples of the method for manufacturing the copper foil with resin include a method in which the resin varnish obtained above is applied to the surface of the copper foil on which the silane coupling agent treatment layer is formed, and then dried to semi-cure the resin composition.

Since the resin layer of the copper foil with resin usually does not contain a glass base material, the application of the resin varnish to the copper foil is performed by coating or the like, but coating can be repeated a plurality of times if necessary. At this time, it is also possible to finally adjust the composition (content ratio) and resin amount to the desired composition (content ratio) and resin amount by repeating coating using a plurality of resin varnishes having different compositions and concentrations.

In a case where the resin varnish is applied and then dried into a semi-cured state, a resin layer containing the resin composition before being cured (A stage) or a resin layer in a semi-cured state (B stage) is obtained by drying the resin varnish under desired heating conditions, for example, at 80° C. to 170° C. for 1 to 10 minutes. After the resin varnish is applied (in the case of prepreg, the resin varnish is impregnated), the organic solvent can be volatilized from the varnish by heating to decrease or remove the organic solvent.

The copper foil with resin of the present embodiment also has effects and advantages similar to those of the above-described copper-clad laminate.

Circuit Board

The copper-clad laminate and copper foil with resin of the present embodiment can be used as a circuit board in which a conductor pattern as a circuit is provided on the surface by etching the copper foil on the surface to form a circuit. Examples of the method for forming a circuit include circuit formation by a semi-additive process (SAP) or a modified semi-additive process (MSAP) in addition to the method described above. The circuit board obtained using the copper-clad laminate and copper foil with resin of the present embodiment is a highly reliable circuit board which exhibits heat resistance and has decreased transmission loss.

The present specification discloses various aspects of a technique as described above, but the main technique is summarized below.

A surface treated copper foil according to one aspect of the present invention includes: a copper foil; a finely roughened particle treatment layer of copper on at least one surface of the copper foil, the finely roughened particle treatment layer including fine copper particles having a particle size of 40 to 200 nm; a heat resistance treatment layer containing nickel on the finely roughened particle treatment layer; a rust prevention treatment layer containing at least chromium on the heat resistance treatment layer; and a silane coupling agent layer on the rust prevention treatment layer. An amount of nickel attached in the heat resistance treatment layer is 30 to 60 mg/m².

With such a configuration, it is possible to provide a surface treated copper foil which can decrease the transmission loss of a high speed signal transmission board, and reliably ensure the adhesive property to a resin base material and particularly heat resistance without a practical problem.

In the surface treated copper foil, the heat resistance treatment layer preferably contains nickel, or nickel and phosphorus. This makes it possible to more reliably obtain the above effect.

A copper-clad laminate according to another aspect of the present invention includes an insulating layer formed of a cured product of a resin composition, and the above-described surface treated copper foil on one surface or both surfaces of the insulating layer.

A copper foil with resin according to further another aspect of the present invention includes a resin layer containing a resin composition or a semi-cured product of the resin composition, and the above-described surface treated copper foil on one surface of the resin layer.

The present invention also includes a circuit board including the copper-clad laminate or the copper foil with resin, in which a conductor pattern as a circuit is provided on the surface of the circuit board.

Hereinafter, the present invention will be described in more details with reference to Examples, but the scope of the present invention is not limited thereto.

EXAMPLES

Untreated Copper Foil

An electrolytic copper foil or a rolled copper foil having a thickness of 18 μm was used as an untreated copper foil in Examples and Comparative Examples. Here, in use of the untreated rolled copper foil, the untreated copper foil was immersed in a hydrocarbon organic solvent for 60 seconds and washed with water, and a rolling oil was removed therefrom. Thereafter, the surface was treated.

Fabrication of Surface Treated Copper Foil

Example 1

As a pretreatment, the oxide layer on the surface of the untreated copper foil was removed and activated by performing electrolysis for 6 seconds at a current density of 5 A/dm² using a copper plate as the cathode and the above-mentioned untreated copper foil as the anode in a 100 g/L sulfuric acid aqueous solution.

Next, a finely roughened particle treatment layer of copper was formed on the laminated surface of the untreated copper foil by performing the treatment under the following bath composition and electrolysis conditions.

Bath Composition
Copper sulfate pentahydrate: 35 g/L
Pentasodium diethylenetriaminepentaacetate: 100 g/L
pH: 4.8
Electrolysis Conditions
Current density: 6 A/dm²
Electric quantity: 50 A·sec/dm²
Liquid temperature: 30° C.
Electrode: copper plate The finely roughened particle treatment layer thus obtained was observed at a magnification of 80,000-fold while tilting the sample table by 40° using a field emission scanning electron microscope FE-SEM (JSM-7800F manufactured by JEOL Ltd.). The heights of the observed copper particles were taken as the values of the particle size, and as a result, the particle sizes of the roughened particles in the finely roughened particle treatment layer were 40 nm as a minimum value and 200 nm as a maximum value.

Subsequently, washing with water was performed, and then a heat resistance treatment layer, which is a second surface treatment layer, was formed by performing the treatment under the following bath composition and electrolysis conditions.

Bath Composition
Nickel sulfate hexahydrate: 30 g/L
Sodium acetate trihydrate: 10 g/L
Sodium hypophosphate monohydrate: 2.0 g/L
pH 4.5
Electrolysis Conditions
Current density: 1.0 A/dm²
Electric quantity: 1.8 A·sec/dm²
Liquid temperature: 32° C.
Electrode: platinum group oxide coated titanium plate The amount of nickel attached in the obtained heat resistance treatment layer was measured by dissolving the copper foil to be treated in nitric acid, diluting the solution, and analyzing the nickel concentration using an ICP emission spectrophotometer. As a result, the amount of attached nickel was 32 mg/m².

Subsequently, washing with water was performed, and then a rust prevention treatment layer to be a third surface treatment layer was formed by performing the treatment under the following electrolysis bath composition, pH, and electrolysis conditions.

Bath Composition
Sodium dichromate: 10 g/L
Zinc ion: 1.0 g/L
Sodium hydroxide: 40 g/L
Liquid temperature: 30° C.

Electrolysis Conditions
Current density: 4 A/dm$^2$
Electric quantity: 5.5 A·sec/dm$^2$
Anode: platinum group oxide coated titanium plate Subsequently, washing with water was performed, and then a silane coupling agent treatment layer to be a fourth surface treatment layer was formed by performing the treatment under the following bath composition, liquid temperature, and immersion time to obtain a surface treated copper foil of Example 1.
Bath Composition
γ-Aminopropyltriethoxysilane: 2 mL/L
Liquid temperature: 30° C.
Immersion time: 15 seconds Example 2

A surface treated copper foil in Example 2 was obtained in the same manner as that in Example 1 except that the second heat resistance treatment layer was formed by performing the treatment under the following bath composition and electrolysis conditions. The amount of nickel attached in the obtained heat resistance treatment layer was 56 mg/m$^2$.
Bath Composition
Nickel sulfate hexahydrate: 30 g/L
Sodium acetate trihydrate: 10 g/L
Sodium hypophosphate monohydrate: 2.0 g/L
Electrolysis Conditions
Current density: 1.6 A/dm$^2$
Electric quantity: 2.7 A·sec/dm$^2$
pH 4.5
Liquid temperature: 32° C.
Anode: platinum group oxide coated titanium plate Comparative Example 1

A surface treated copper foil in Comparative Example 1 was obtained in the same manner as that in Example 1 except that the second heat resistance treatment layer was not provided. The amount of nickel attached in the obtained surface treated copper foil was 0 mg/m$^2$.

Comparative Example 2

A surface treated copper foil in Comparative Example 2 was obtained in the same manner as that in Example 1 except that the second heat resistance treatment layer was formed by performing the treatment under the following bath composition and electrolysis conditions. The amount of nickel attached in the obtained heat resistance treatment layer was 82 mg/m$^2$.
Bath Composition
Nickel sulfate hexahydrate: 30 g/L
Sodium acetate trihydrate: 10 g/L
Sodium hypophosphate monohydrate: 2.0 g/L
Electrolysis Conditions
Current density: 2.1 A/dm$^2$
Electric quantity: 3.6 A·sec/dm$^2$
pH 4.5
Liquid temperature: 32° C.
Anode: platinum group oxide coated titanium plate Comparative Example 3

A surface treated copper foil in Comparative Example 3 was obtained in the same manner as that in Example 1 except that the second heat resistance treatment layer was formed by performing the treatment under the following bath composition and electrolysis conditions. The amount of nickel attached in the heat resistance treatment layer of the obtained surface treated copper foil was 106 mg/m$^2$.
Bath Composition
Nickel sulfate hexahydrate: 30 g/L
Sodium acetate trihydrate: 10 g/L
Sodium hypophosphate monohydrate: 2.0 g/L
Electrolysis Conditions
Current density: 2.8 A/dm$^2$
Electric quantity: 4.9 A·sec/dm$^2$
pH 4.5
Liquid temperature: 32° C.
Anode: platinum group oxide coated titanium plate Comparative Example 4

A surface treated copper foil in Comparative Example 4 was obtained in the same manner as that in Example 1 except that the first finely roughened particle treatment layer was formed by performing the treatment under the following bath composition and electrolysis conditions. The particle sizes of the roughened particles in the obtained finely roughened particle treatment layer were 700 nm as a minimum value and 1400 nm as a maximum value. The amount of nickel attached in the obtained heat resistance treatment layer was 32 mg/m$^2$.
Bath Composition
Bath (1) Copper sulfate pentahydrate: 47 g/L
    Sulfuric acid: 100 g/L
Bath (2) Copper sulfate pentahydrate: 200 g/L
    Sulfuric acid: 100 g/L
Electrolysis Conditions
Fine copper particles were attached by performing electrolysis in the bath (1) under electrolysis conditions of a current density of 50 A/dm$^2$, an electric quantity of 130 A·sec/dm$^2$, and a liquid temperature of 30° C., and then electrolysis was further performed in the bath (2) under electrolytic conditions of a current density of 5 A/dm$^2$, an electric quantity of 400 A·sec/dm$^2$, and a liquid temperature of 40° C. to form a finely roughened particle treatment layer.

Comparative Example 5

A surface treated copper foil in Comparative Example 5 was obtained in the same manner as that in Example 1 except that the second heat resistance treatment layer was formed by performing the treatment under the following bath composition and electrolysis conditions and that a rust prevention treatment layer was not formed. The amount of nickel attached in the obtained heat resistance treatment layer was 42 mg/m$^2$.
Bath Composition
Nickel sulfate hexahydrate: 30 g/L
Sodium acetate trihydrate: 10 g/L
Sodium hypophosphate monohydrate: 2.0 g/L
Electrolysis Conditions
Current density: 1.3 A/dm$^2$
Electric quantity: 2.3 A·sec/dm$^2$
pH 4.5
Liquid temperature: 32° C.
Anode: platinum group oxide coated titanium plate
Fabrication of Laminates for Evaluation
Fabrication of Substrates for Transmission Property Test
Each of prepregs (manufactured by Panasonic Corporation, Megtron 6 (R-5670N), No. 1078 type) was stacked by two sheets. Thereafter, a copper foil presented in each of Examples and Comparative Examples was stacked on both surfaces of each stacked body, and the resultant stacked body was hot-pressed under the conditions of a temperature of 200° C., a time of 2 hours, and a pressure of 3 MPa to obtain a copper-clad laminate for evaluation having a thickness of 150 μm. Next, one surface of the obtained double-sided plate was processed with a line width of 100 to 200 μm and then two prepregs were secondarily laminated so as to sandwich the processed surface to fabricate a three-layered plate. The line width was adjusted after finishing so that the characteristic impedance of the circuit was 50Ω.

Fabrication of Substrates for Heat Resistance Test

Each of prepregs (manufactured by Panasonic Corporation, Megtron 6 (R-5670N), No. 2116 type) was stacked by six sheets, and a surface treated copper foil presented in each of Examples and Comparative Examples was stacked on both surfaces of each stacked body, and the resultant stacked body was hot-pressed under the conditions of a temperature of 200° C., a time of 2 hours, and a pressure of 3 MPa to obtain a copper-clad laminate for evaluation having a thickness of 0.8 mm.

Evaluation Test

Laminates for evaluation prepared in the above-described manner were evaluated in the following manner.

Transmission Properties at 20 GHz

The transmission properties of the laminate for evaluation obtained by using the surface treated copper foil in each of Examples and Comparative Examples were evaluated by measuring the passage loss using a network analyzer (N5230A manufactured by Keysight Technologies, Inc.). The evaluation frequency was 20 GHz.

Oven Heat Resistance Test

When test pieces fabricated using the obtained copper foil-clad laminates in conformity with JIS C 6481 were treated for 1 hour in a thermostatic chamber with air circulating apparatus set at 250° C., 260° C., 280° C., and 300° C., a case where abnormality was not observed in all five test pieces was determined as "Good", and a case where "swelling" or "peeling off" occurred in one or more of five test pieces was determined as "Poor". In the present test, a sample that is evaluated as "Good" at 280° C. is acceptable.

The test results are presented in Table 1.

TABLE 1

| | | Example 1 | Example 2 | Comparative Example 1 | Comparative Example 2 | Comparative Example 3 | Comparative Example 4 | Comparative Example 5 |
|---|---|---|---|---|---|---|---|---|
| Copper foil | | | | | | | | |
| Ni: 0 mg/m², Fine copper particle size: 40-200 nm | | | | ● | | | | |
| Ni: 32 mg/m², Fine copper particle size: 40-200 nm | | ● | | | | | | |
| Ni: 56 mg/m², Fine copper particle size: 40-200 nm | | | ● | | | | | |
| Ni: 82 mg/m², Fine copper particle size: 40-200 nm | | | | | ● | | | |
| Ni: 106 mg/m², Fine copper particle size: 40-200 nm | | | | | | ● | | |
| Ni: 32 mg/m², Fine copper particle size: 700-1400 nm | | | | | | | ● | |
| Ni: 42 mg/m², Fine copper particle size: 40-200 nm, without rust prevention treatment layer | | | | | | | | ● |
| Evaluation items | | | | | | | | |
| Oven heat resistance | Kept at 250° C. for 1 h | Good | Good | Poor | Good | Good | Good | Good |
| | Kept at 260° C. for 1 h | Good | Good | | Good | Good | Good | Good |
| | Kept at 280° C. for 1 h | Good | Good | | Good | Good | Poor | Poor |
| | Kept at 300° C. for 1 h | Poor | Good | | Good | Good | | |
| Transmission loss | 20 GHz | −29.5 dB/m | −30 dB/m | −29 dB/m | −32 dB/m | −33 dB/m | −35 dB/m | −29.5 dB/m |

As is clear from the results in Table 1, it was confirmed that the laminates fabricated using the surface treated copper foil of the present invention exhibit excellent heat resistance and also excellent transmission properties.

In contrast, in Comparative Example 1 in which the amount of nickel attached in the heat resistance treatment layer was 0, it was not possible to obtain heat resistance. On the other hand, in Comparative Example 2 and Comparative Example 3 in which the amount of nickel attached in the heat resistance treatment layer was excessive, the transmission properties were insufficient.

In Comparative Example 4 in which the copper particle size in the finely roughened particle treatment layer was large, the transmission properties were inferior and the heat resistance was not sufficient. Also, in Comparative Example 5 in which the rust prevention treatment layer was not formed, it was not possible to obtain sufficient heat resistance.

This application is based on Japanese Patent Application No. 2019-018095 filed in Japan Patent Office on Feb. 4, 2019, the entire disclosure of which are hereby incorporated by reference.

Although the present invention is fully described by way of example with reference to the accompanying drawings through the embodiment, it is to be understood that various changes and/or modifications will be apparent to those skilled in the art. Therefore, unless otherwise such changes and modifications to be made by those skilled in the art depart from the scope of the present invention hereinafter defined, they should be construed as being included therein.

INDUSTRIAL APPLICABILITY

The present invention has a wide range of industrial applicability in the technical field relating to electronic materials for transmission boards (circuit boards) and various devices using the same.

The invention claimed is:
1. A surface treated copper foil comprising:
a copper foil;
a finely roughened particle treatment layer of copper on at least one surface of the copper foil, the finely roughened particle treatment layer including fine copper particles having a particle size of 40 to 200 nm;
a heat resistance treatment layer containing nickel on the finely roughened particle treatment layer;
a rust prevention treatment layer containing at least chromium on the heat resistance treatment layer; and
a silane coupling agent treatment layer on the rust prevention treatment layer, wherein
an amount of nickel attached in the heat resistance treatment layer is 30 to 60 mg/m$^2$, and
the heat resistance treatment layer is composed of nickel, or nickel and phosphorus.
2. A copper-clad laminate comprising:
an insulating layer containing a cured product of a resin composition; and
the surface treated copper foil according to claim 1 on one surface or both surfaces of the insulating layer.
3. A copper foil with resin comprising:
a resin layer containing a resin composition or a semi-cured product of the resin composition; and
the surface treated copper foil according to claim 1 on one surface of the resin layer.
4. A circuit board comprising:
the copper-clad laminate according to claim 2, wherein a conductor pattern as a circuit is provided on a surface of the circuit board.
5. A circuit board comprising the resin-attached copper foil according to claim 3, wherein a conductor pattern as a circuit is provided on a surface of the circuit board.

* * * * *